United States Patent
Benzel et al.

(10) Patent No.: US 7,160,750 B2
(45) Date of Patent: Jan. 9, 2007

(54) METHOD OF PRODUCING A SEMICONDUCTOR SENSOR COMPONENT

(75) Inventors: Hubert Benzel, Pliezhausen (DE); Heribert Weber, Nuertingen (DE); Frank Schaefer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 166 days.

(21) Appl. No.: 10/473,762

(22) PCT Filed: Feb. 21, 2002

(86) PCT No.: PCT/DE02/00608

§ 371 (c)(1),
(2), (4) Date: Mar. 30, 2004

(87) PCT Pub. No.: WO02/081363

PCT Pub. Date: Oct. 17, 2002

(65) Prior Publication Data

US 2004/0147057 A1 Jul. 29, 2004

(30) Foreign Application Priority Data

Apr. 7, 2001 (DE) ............... 101 17 486

(51) Int. Cl.
*H01L 21/00* (2006.01)
(52) U.S. Cl. ............... 438/48; 257/E21.001
(58) Field of Classification Search .......... 438/48, 438/51, 54, 55, 64, 106, 689, 745
See application file for complete search history.

(56) References Cited

U.S. PATENT DOCUMENTS

| 4,680,963 A | 7/1987 | Tabata et al. |
| 5,231,878 A | 8/1993 | Zanini-Fisher et al. |
| 5,542,558 A * | 8/1996 | Benz et al. ............ 216/2 |
| 6,521,313 B1 * | 2/2003 | Artmann et al. ........ 428/53 |
| 7,037,438 B1 * | 5/2006 | Benzel et al. .......... 216/2 |

FOREIGN PATENT DOCUMENTS

| DE | 195 18 371 | 10/1996 |
| DE | 197 52 208 | 6/1999 |
| WO | WO 98 50763 | 11/1998 |
| WO | WO 02/38491 | 5/2002 |

OTHER PUBLICATIONS

W. Lang et al.: "Porous silicon: A novel material for microsystems" Sensor and Actuators A, Elsevier Sequoia S.A., Lausanne, Ch, vol. 51, No. 1, Oct. 1995, pp. 31-26.
P. Steiner et al.: "Mikrostrukturierung MIT Paroesem Silizium" ITG-Fachverichte, VDE Verlag, Berlin, De, vol. 126, Mar. 1994, pp. 285-290.
Osamu Tabata, et al. "Monolithic Pressure-Flow Sensor," IEEE Transactions On Electron Devices, vol. ED. 34, No. 12, Dec. 1987, pp. 2456-2462.

(Continued)

*Primary Examiner*—Scott B. Geyer
(74) *Attorney, Agent, or Firm*—Kenyon & Kenyon LLP

(57) ABSTRACT

A method for manufacturing a semiconductor component, such as, for example, a multilayer semiconductor component including a micromechanical component, such as, for example, a heat transfer sensor having a semiconductor substrate of silicon, and a sensor region. For inexpensive manufacture of a thermal insulation between the semiconductor substrate and the sensor region a porous layer is provided in the semiconductor component.

18 Claims, 2 Drawing Sheets

OTHER PUBLICATIONS

W. Lang et al., "Porous Silicon Technology For thermal Sensors", Sensors and Materials, vol. 8, No. 6 (1996), pp. 327-344.

R. W. Tjerkstra et al., "Multi-Walled Microchannels: Free-Standing Porous Silicon Membranes For Use in μTAS", Journal of Microelectromechanical Systems, vol. 9, No. 4, Dec. 2000, pp. 495-501.

I. Mizushima et al., "Empty-space-in-silicon technique for fabricating a silicon-on-nothing structure", Applied Physics Letters, vol. 77, No. 20, Nov. 13, 2000, pp. 3290-3292.

G. Lammel, "Free-standing, mobile 3D porous silicon micro-structures", Sensors and Actuators, vol. 85 (2000), pp. 356-360.

* cited by examiner

METHOD OF PRODUCING A SEMICONDUCTOR SENSOR COMPONENT

FIELD OF THE INVENTION

The present invention relates to a method for manufacturing a semiconductor component, such as, for example, a multilayer semiconductor component, and a semiconductor component manufactured by the method.

BACKGROUND INFORMATION

Semiconductor components, such as, for example, micromechanical heat transfer sensors, may be manufactured by bulk or surface micromechanical methods. Manufacturing bulk micromechanical components may be relatively complex and therefore may be expensive. With surface micromechanical components, it may be complicated to manufacture a cavern. A process sequence for manufacturing a cavern by surface micromechanics may involve, for example, depositing a sacrificial layer, depositing of a membrane layer (such as, for example, polysilicon), creating openings in the membrane layer and/or opening a lateral etching channel, etching out the sacrificial layer and sealing the openings, with the inside pressure of the cavern being defined during sealing.

SUMMARY OF THE INVENTION

According to an exemplary method and/or exemplary embodiment of the present invention, a micromechanical component having sensor elements, including, for example, elements for a heat transer sensor, may be manufactured easily and inexpensively by surface micromechanics.

The heat transfer sensor may be, for example, a sensor for measuring an air stream and/or a gas stream, an air pressure and/or a gas pressure on the basis of the heat transferred to the air and/or a gas, such as, for example, hydrogen.

A porous layer may be created in a semiconductor component, including, for example, a heat transfer sensor. The porous layer may be formed in a semiconductor substrate including, for example, in a silicon substrate or in an epitaxial layer, such as, for example, a silicon layer deposited on the semiconductor substrate. The porous layer may be manufactured inexpensively and may serve the function of thermal insulation of the semiconductor substrate and/or the epitaxial layer with respect to a sensor area provided in the semiconductor component. Because of the thermal insulation, a heat flow from the sensor area to the substrate and/or the epitaxial layer may be reduced. The response sensitivity of a sensor provided in the sensor area may be increased and its response time may be shortened. To do so, the cover layer of the substrate or the epitaxial layer may be etched in the area of the sensor elements to be manufactured later, so that openings, that is etching openings, such as, for example, pores or cavities, may be formed in these sensor elements. The thickness and/or porosity of the porous layer may be adjusted or varied as required by the etching process which is explained below. For example, the thickness of the porous layer may be in the range of approximately 2 µm to 80 µm.

A cavern or cavity may be created in the semiconductor substrate or in the epitaxial layer using an etching medium in the area of the porous layer or underneath it to further improve upon the thermal insulation so that the substrate and/or the epitaxial layer may be isolated with respect to the sensor area. The etching medium or one or more additional etching media may reach deeper regions of the substrate or the epitaxial layer through the etching openings or pores of the porous layer which may be open to the outside. The part of the semiconductor substrate, such as, for example, the epitaxial layer, which is decomposed by the etching medium and/or additional etching media in this area may be removed through the openings or pores in the cover layer and/or through an external access opening to this area. The porous layer or cover layer above the cavity or cavern may be thin and at the same time may be configured with adequate load bearing capacity so that additional layers may be deposited on the porous layer and structured. The porous layer above the cavity may have a thickness of approximately 2 µm to 10 µm, such as, for example, 3 µm to 5 µm.

In a exemplary embodiment of the present invention, measures may be taken in the etching process to ensure that the rate of expansion of the pores in the cover layer is lower or much lower, than the rate of expansion of the pores or cavities in the area of the substrate or the epitaxial layer which forms the subsequent cavity or cavern.

This may be achieved according to an exemplary embodiment of the present invention by selecting the etching parameters and/or the etching medium or etching media in etching the pores in the cover layer that are different from the etching parameters and/or the etching medium or etching media in etching the pores or cavities in the area of the subsequent cavern.

It may be desired here that for removal of the silicon to be decomposed to manufacture the cavern, the porosity of the cover layer may be adjustable to be merely appropriately high in a manner that is easily controllable in terms of the process technology. However, the cavern may be manufactured rapidly and thus inexpensively.

According to a exemplary embodiment of the present invention, the etching parameters may be adjusted and/or the etching media in etching the cavern may be selected so that the rate of expansion of the pores or cavities beneath the porous cover layer is so high that the pores or cavities "overlap" one another very rapidly. At first this may result in a single initially superficial starting cavity in the substrate or in the epitaxial layer which expands in depth over time and forms the cavern.

In an alternative exemplary embodiment of the present invention, the etching parameters and/or the etching medium or media should be selected in etching the cavern so that the porosity of the region of the substrate or the epitaxial layer which later forms the cavern is higher than the porosity of the cover layer. The precursor of the subsequent cavern may have a porosity higher than 70% with respect to the ratio of the volume of all the cavities of the cavern to the volume of the material of the cavern that has not been etched out. The cavern may be formed subsequently from the porous region of the substrate or the epitaxial layer in executing one or more heating steps, including, for example, heating to a temperature above approximately 900° C.

During heating, in an atmosphere of hydrogen, nitrogen, or noble gas as at a temperature of more than approximately 900° C., for example, the pores may become rearranged in the region of the silicon which forms the subsequent cavern at a porosity of approximately more than 70%, so that a single large pore in the form of a cavity or a cavern may be formed beneath the cover layer which has a low porosity. The pores on the top of the layer having a low porosity may be mostly sealed in this high-temperature step, so that additional layers (such as, for example, one or more monocrystalline layers) may be deposited on the cover layer.

According to an exemplary embodiment of the present invention, the etching medium and/or the etching media for creating the openings and/or pores in the cover layer and/or for creating the cavern may be hydrofluoric acid (HF) or a liquid mixture or a chemical compound containing hydrogen fluoride.

In a exemplary embodiment of the present invention, a highly volatile component (including, for example, an alcohol, such as, for example ethanol) and/or purified water may be added to the etching medium or etching media to dilute the etching medium or media.

The addition of ethanol is intended to lower the surface tension of an etching medium containing it, thus facilitating better wetting of the silicon surface and penetration of the etching medium into the etched pores or openings or cavities. Furthermore, the bubbles formed during the etching process should be smaller than those formed without the addition of ethanol to the etching medium, and therefore the bubbles may be better able to escape through the pores of the cover layer. Therefore, the pore size and/or porosity of the cover layer may be kept smaller in a more desired manner than would be the case without the addition of the alcohol.

In another exemplary embodiment of the present invention, the openings and/or pores in the cover layer and/or in the area of the subsequent cavern may be produced by an electrochemical method, including, for example, using the etching medium or media mentioned above.

Furthermore, in an exemplary embodiment of the present invention using an electrochemical etching process (such as, for example, an etching process using hydrogen fluoride (HF)), the rate of expansion of the pores or cavities formed in the etching process may be influenced by applying an electric voltage and an electric current induced thereby through the etching medium or media. The rate of expansion of the pores or cavities may depend on the doping of the silicon substrate to be etched, the current density, the HF concentration in the etching medium and the temperature. These are merely examples of relevant process parameters of an etching process according to the present invention.

According to an exemplary embodiment of the present invention, the etching medium, the HF concentration in the etching medium, and/or the doping of the area to be etched and/or the temperature and other process parameters of the etching process are selected so that the etching process (that is, the formation of pores or cavities) may be adjusted in a suitable manner and/or stopped when the electric voltage is turned off, for example, as abruptly as possible.

In an exemplary electrochemical etching process according to the present invention using a single etching medium and/or two or more etching media, in a first period of time during which the etching medium is in the area of the cover layer a first current density which is not necessarily constant over time is established in the etching medium. During a second period of time during which the particular etching medium is in the area of the cavern to be created, a second current density, for example, which is not necessarily constant over time but is higher or much higher than the or a current density is established during the first period of time. In this manner, the cavern or a precursor of the cavern may be formed by pores or cavities, whose rate of expansion during the process of etching the cavern is higher or much higher than the rate of expansion of the pores for manufacturing the porous cover layer. In another exemplary embodiment of the present invention, the area of the cover surface of the substrate or the epitaxial layer which is to be etched to form pores may be surrounded by a masking layer (that is, a supporting layer which allows free access of the etching medium or media to the area to be etched to form pores and which shields those areas of the cover layer of the substrate or the epitaxial layer which are not to be etched to form pores to prevent an etching attack there).

According to an exemplary embodiment of the present invention, the supporting layer is configured so that it mechanically secures the region or the layer of the cover surface, which is to be etched to form pores, on the unetched portion of the substrate or the epitaxial layer, during and after the etching of the cavern.

In an exemplary embodiment of the present invention, the supporting layer is created before etching the region or layer which is to be etched to form pores by first providing n-type doping on the nearest surrounding region around the layer of the cover surface to be etched to form pores on a p-doped silicon substrate. This may largely prevent "underetching" of the substrate, including, for example, in the area in which the layer that is etched to form pores is mechanically joined to the silicon substrate. Otherwise there may be the risk, in the case of a thin porous layer, for example, that the layer might separate from the substrate. In addition, a silicon nitride layer may be used as a mask and to protect against an etching attack of electronic circuits which may be arranged beneath it.

Alternatively or additionally, instead of the n-type doping and/or an n-doped layer, a metal layer or metal mask may be provided which may also largely prevent underetching of the substrate or the epitaxial layer. However, use of a metal layer or metal mask may be expedient only if no circuits are to be provided in the substrate or in the epitaxial layer because otherwise metal atoms remaining in the substrate or in the epitaxial layer even after removal of the metal layer or metal mask may impair the functioning of the circuits.

In another exemplary embodiment of the present invention, a porous etched cover layer, such as, for example, a silicon layer, may be pretreated before additional layers, such as, for example, one or more silicon layers, are applied to or deposited on it. A goal of the pretreatment is to close the pores in the porous etched cover layer entirely or partially to further improve upon the quality of the silicon layer(s) applied thereto or deposited thereon, if required or expedient.

An exemplary pretreatment according to the present invention may include heating the porous etched cover layer, the heating being performed at a high temperature, including, for example, at a temperature in the range from approximately 900° C. to approximately 1200° C. Heating may be performed under a hydrogen atmosphere, a nitrogen atmosphere and/or a noble gas atmosphere.

As an alternative or in addition to the aforementioned pretreatment, a (slight) oxidation of the porous etched silicon layer may be provided. The oxidation may be performed with (slight) addition of oxygen to the atmosphere to which the porous cover layer is exposed in the reactor, the oxidation may take place at a temperature in the range from approximately 400° C. to 600° C. The term "slight" is understood to refer to oxidation which largely closes the pores of the porous etched cover layer entirely or partially and forms an approximately network-like oxide structure.

According to an exemplary embodiment of the present invention, the slightly porous layer or cover layer is etched with an etching medium which has a hydrogen fluoride concentration (HF concentration) in the range from approximately 20% to approximately 50%, such as, for example, approximately 30% to approximately 40% (such as, for example, approximately 33%).

In another exemplary embodiment of the present invention, the porous layer which forms a precursor of the subsequent cavity or cavern is etched with an etching medium which has a hydrofluoric acid concentration (HF concentration) in the range from approximately 0% to approximately 40%, such as, for example, approximately 5% to approximately 20% (such as, for example, less than approximately 20%). The remaining portion of the etching medium which is not formed by hydrofluoric acid may be largely made up of an alcohol, such as, for example, ethanol.

To achieve a high rate of expansion of the pores or cavities in the layer to be decomposed during an etching step, according to the present invention as defined above, an exemplary etching medium is provided to form a cavity or a cavern at a rate of expansion in which the pores or cavities "overlap" one another very rapidly and thus form a single "giant pore". The etching medium according to the present invention may include a hydrofluoric acid concentration (HF concentration) in the range from approximately 0% to approximately 5% such as, for example, approximately 1% to approximately 3% (such as, for example, less than approximately 5%). The remaining portion of this etching medium not formed by hydrofluoric acid may be composed mostly of an alcohol (such as, for example ethanol) and/or purified water.

DETAILED DESCRIPTION

Figure 1:
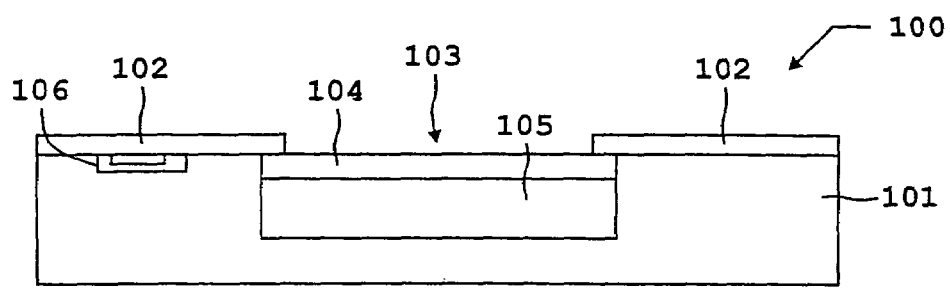
FIG. 1 shows a cross section of a precursor of a heat transfer sensor according to an exemplary embodiment of the present invention after producing a first silicon layer having a low porosity in a silicon substrate having a second porous silicon layer beneath the first silicon layer, the second layer having a higher porosity.
Figure 4:
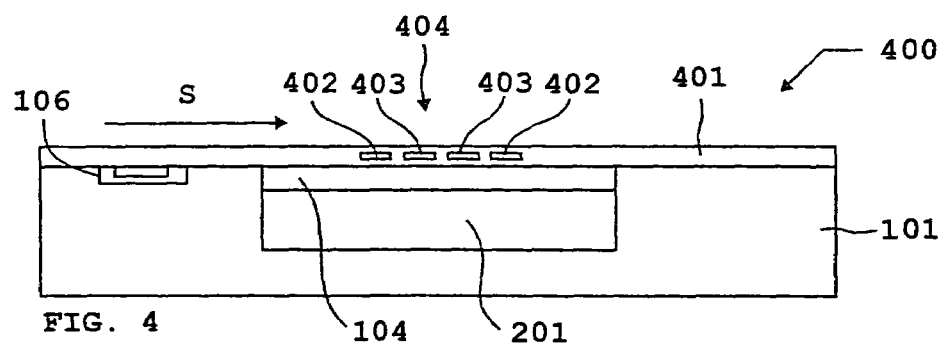
FIG. 4 shows a cross section of a heat transfer sensor manufactured on the basis of the precursor shown in FIG. 1 or 2 and provided with sensor elements.

FIG. 1 shows a cross section of a precursor 100 of a heat transfer sensor 400 depicted in FIG. 4. To manufacture heat transfer sensor 400 depicted in FIG. 4, first a masking layer 102 is produced on the top of a silicon substrate 101, a region 103 not covered by masking layer 102 being formed. The masking layer may be, for example, a nitride layer, an n-doped layer (in the case of a p-doped silicon substrate), or some other suitable layer which is largely unattacked by the etching medium used subsequently. An integrated circuit 106 on the top of the silicon substrate may be adequately protected from etching attack by masking layer 102.

The top of silicon substrate 101 is etched electrochemically using a suitable etching medium such that the etching medium creates small openings or pores in silicon substrate 101 directly beneath region 103 which is not covered. A silicon layer 104 having a low porosity is formed. The etching medium passes through these small openings or pores in silicon layer 104 to reach deep regions of silicon substrate 101 and also forms pores in the silicon there. A porous silicon layer 105 is formed here beneath porous silicon layer 104.

The etching medium for electrochemical etching, such as, for example, wet etching, may be hydrofluoric acid (HF) or an etching medium which contains hydrofluoric acid (HF), among other things. According to an exemplary embodiment of the present invention, an electric field may be created between the top and the bottom of silicon substrate 101, the rate of expansion of the pores or openings or cavities being influenced via the electric field strength or the electric current density thus established.

In an exemplary electrochemical etching method according to the present invention, precursors of the heat transfer sensors to be etched are placed in a pan-like container which is filled with the etching medium, and an electric voltage is applied at opposing ends of the etching medium so that the electric field is formed.

To ensure that porous silicon layer 104 is formed in the region directly beneath region 103 recessed beneath masking layer 102, an electric current density, which may not necessarily be constant, is established in a first step, which is not covered after the etching medium is applied to region 103, which is also not covered. The electric current density may be selected in so that openings or pores are formed in silicon substrate 101 directly beneath region 103 which is not covered.

Another criterion for the electric current density, which may be established in the first step and may not necessarily be constant is to establish such an electric current density at which suitable openings or pores are formed in silicon substrate 101 directly beneath region 103 which is not covered. Suitable, for example, are such openings or pores which subsequently allow the deposition of additional layers, such as, for example, silicon layers, on porous silicon layer 104 formed during the etching process. Therefore, the openings or pores may have only an adequate size or diameter. The openings or pores may have a diameter of approximately 10 nm to 100 nm, for example, including approximately 10 nm to 30 nm.

This is just one example of suitable openings or pores.

After the etching medium has penetrated through porous silicon layer 104, in a second step the current density may be increased in relation to the current density during the first step, so that the rate of expansion of the pores or cavities is increased and larger pores are allowed to form in silicon layer 105 in comparison with the pores in porous silicon layer 104.

The silicon decomposed by the etching medium is removed during the etching process and/or subsequently through the openings or pores in porous silicon layer 104 and "fresh" etching medium is supplied.

In an exemplary first variant of the process according to the present invention for manufacturing the precursor of a heat transfer sensor, such as, for example, a cavity as shown in FIG. 1, the etching process for manufacturing subsequent cavity 201 (FIG. 2) may be adjusted through the choice of suitable process parameters and/or one or more suitable etching media such that the porosity of silicon layer 105, forming subsequent cavity 201 is sufficiently high. The term "sufficiently" is understood, for example, to refer to a porosity which is greater than 70% and less than 100%. A heating step is then performed. The heating may be performed under an atmosphere of hydrogen, nitrogen or noble gas and/or at a temperature of more than approximately 900° C. Because of the high porosity of silicon layer 105, the pores become rearranged during heating so that a single large pore is formed beneath slightly porous silicon layer 104, i.e., the cavity shown in FIG. 2 or cavern 201 depicted there. The pores on the top of silicon layer 104 having a low porosity are largely closed during heating, i.e., the high-temperature step, so that additional layers may be deposited on this layer.

In an exempplary second variant according to the present invention, which is not shown here but may be provided, for manufacturing the precursor of a heat transfer sensor and/or a cavity 201, the process parameters may be adjusted after forming low-porosity silicon layer 104 so that the rate of expansion of the pores or cavities within a thin transitional layer beneath silicon layer 104 increases rapidly, and the pores in this transitional layer coalesce or more or less "overlap." In other words, the transitional layer is a cavity which is initially superficial but grows in depth during the continued etching process, ultimately forming the cavity or cavern 201. In other words, not only are new pores created and then increased in size but also the transitional layer, an initially shallow superficial "giant pore," grows slowly in depth.

According to an exemplary embodiment of the present invention, the etching medium and/or etching media may be provided with a readily volatile constituent, such as, for example, an alcohol may be used, including, for example, ethanol.

If required or expedient, according to an exemplary emdoiment and/or exemplary method of the present invention the porous region of the cover surface of substrate 101 which is to be etched to create pores may be provided with a masking layer and/or a supporting layer, which mechanically secures the layer of the cover surface to be made porous by etching, including silicon layer 104 (not shown) during and after the etching, that is, during the creation of cavity 201 at the connecting points in the area of the unetched cover surface of the substrate. Such a supporting layer may be created, for example, by first providing the initially surrounding region around silicon layer 104, which is to be etched to make it porous, of the cover surface of p-doped silicon substrate 101 is provided with an n-type doping. This may largely prevent "underetching" of silicon substrate 101 in the area of the connecting points, i.e., interfaces between silicon layer 104 and silicon substrate 101. Furthermore, care may be taken to ensure that even a thin porous silicon layer 104, for example, may be reliably attached to silicon substrate 101.

Figure 3:
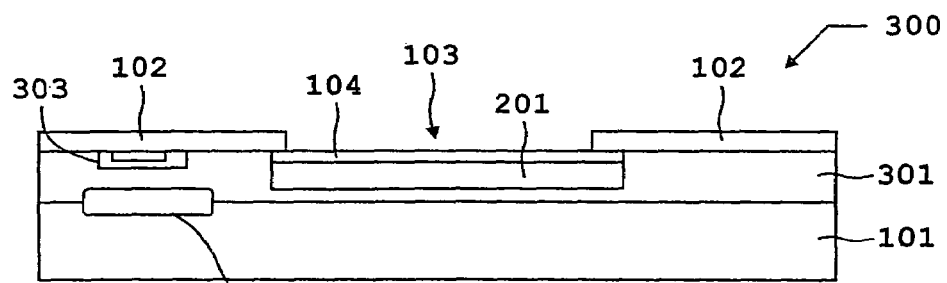
FIG. 3 shows a cross section of a precursor of a second variant of a heat transfer sensor having an epitaxial layer deposited on the silicon substrate.

FIG. 3 shows a precursor 300 of an exemplary second variant of a heat transfer sensor (not shown) in cross section. Precursor 300 shown here has a silicon substrate 101, a silicon epitaxial layer 301 deposited on silicon substrate 101 and a masking layer 102 applied to the top of silicon epitaxial layer 301. Masking layer 102 has a region 103 which does not cover silicon epitaxial layer 301. Furthermore, an integrated circuit 303 and/or 302 is formed in the top of silicon epitaxial layer 301 and between the silicon substrate, i.e., wafer 101 and epitaxial layer 301.

Using an exemplary method described here, a porous silicon layer 104 is created in silicon epitaxial layer 301 and a cavity or a cavern 201 is created in region 103 beneath that.

Figure 2:
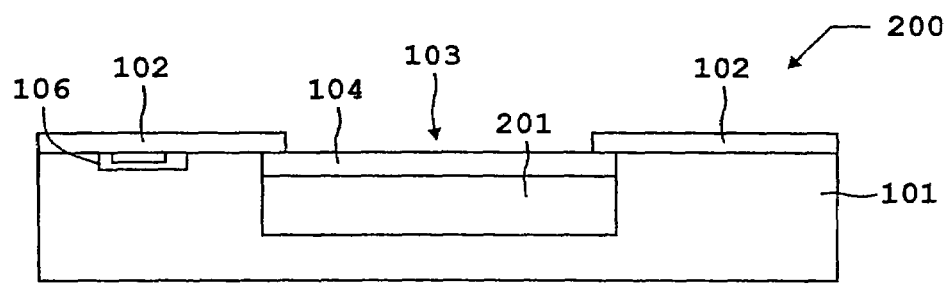
FIG. 2 shows a cross section of the precursor shown in FIG. 1 after the second silicon layer having a high porosity has become a cavity.

Both exemplary variants of the heat transfer sensors depicted in FIGS. 1 through 3 have a porous load-bearing cover layer 104 above a cavity or a cavern 201 so that additional layers may be deposited on the cover layer. The thickness of porous cover layer 104 may amount to approximately 2 µm to 10 µm, including, for example, approximately 3 µm to 5 µm. In addition, one or more defined openings may be introduced into cover layer 104 to achieve pressure equalization between cavity 201 and the environment.

FIG. 4 shows a heat transfer sensor 400 manufactured on the basis of the precursor depicted in FIG. 1 or 2, shown in cross section. After removing masking layer 102, porous silicon layer 104 is sealed by deposition of a sealing layer 401 or by oxidation. The pressure prevailing in deposition of sealing layer 401 or in oxidation defines the pressure enclosed in the cavity or in cavern 201. The thickness and porosity of the silicon layer may be such that the layer has an adequate mechanical stability with respect to the substrate under the boundary conditions of the lowest possible thermal conductivity, for example, the best possible thermal insulation of the sensor region with respect to the substrate. A pressure which is reduced with respect to atmospheric pressure, such as, for example, a vacuum, may be enclosed in the cavity or in cavern 201 to achieve a better thermal insulation between a sensor region 404 provided above porous silicon layer 104 and silicon substrate 101. This may further reduce the transfer of heat from the sensor area to silicon substrate 101 and thus may yield a higher response sensitivity or response rate of sensor elements arranged in the sensor region.

If after deposition of sealing layer 401, gas, such as, for example, hydrogen, in the cavity or in cavern 201 may be mostly removed from the cavity or cavern 201, using a high-temperature step according to an exemplary method of the present invention (e.g., under a nitrogen atmosphere). Because of its small molecule size and the hydrogen concentration gradient, hydrogen diffuses, for example, through sealing layer 401, which may be thinner in relation to the substrate.

The gas-tight or airtight sealing of the cavity or cavern 201 may be performed in a reactor or in a vapor deposition system and may not be required to be performed after the manufacturing the cavity or cavern 201 but instead may be performed as one of the last method steps so that no warps develop in porous layer 104 which might result in imaging errors in a subsequent optical structuring operation (lithography).

Before deposition of sealing layer 401, porous silicon layer 104 may be pretreated. An exemplary pretreatment according to the present invention involves heating porous silicon layer 104. Heating may be performed at a high temperature, e.g., at a temperature in the range from approximately 900° C. to approximately 1200° C. and/or heating is performed under an atmosphere of hydrogen, nitrogen, and/or noble gas.

With pretreatment the pores in porous etched monocrystalline silicon layer 104 may be mostly sealed so that additional layers, silicon layers, for example, may be deposited on it. Such a pretreatment may be omitted, for example, for reasons of cost, if the quality of the deposited silicon layers is satisfactory even without a pretreatment.

Sealing layer 401 may be formed from one or more layers of silicon oxide, silicon nitride, polysilicon, or monocrystalline silicon. Due to the deposition of different silicon layers, such as, for example, silicon oxide and silicon nitride layers, a tensile stress is produced in sealing layer 401, counteracting the pressure difference between the top of the membrane and the bottom of the membrane so that warping in sealing layer 401 due to the pressure difference may be prevented.

In sensor area 404, sensor elements 402, 403 are created above porous silicon layer 104 on sealing layer 401, that is, on oxidized silicon layer 104. The sensor elements are formed, for example, by deposition and structuring of metal, including, for example, platinum. As an alternative, sensor elements 402 and 403 may be created by deposition of polysilicon on sealing layer 401, for example, subsequent doping of the deposited polysilicon and then structuring the deposited polysilicon layer. Furthermore, sensor elements 402 and 403 may be created by deposition of a polysilicon layer and structured doping of the polysilicon layer (not shown). Sensor elements 402 and 403 include resistors which function as temperature sensors and as heating elements, temperature sensor 402 being arranged in outer sensor area 404 and heating elements 403 being positioned in the internal sensor area. Only one heating element 403, for example, is operated, and the second heating element 403 functions as a reserve when the first heating element fails. A stream of air or gas flowing in direction of flow S over the surface of heat transfer sensor 400 receives the heat released by heating elements 403, resulting in a temperature gradient between two temperature sensors 402. Heat transfer sensor 400 may be arranged, for example, in the intake channel of a motor vehicle for measuring and/or controlling the combustion air supplied to it. On the basis of the temperature gradient, which is analyzed by integrated circuit 106, for example, the quantity of air or gas flowing over heat transfer sensor 400, and its direction of flow, may be determined.

Additional layers may be applied to sensor elements 402 and 403 and structured if required. For example, one or more silicon nitride layers may be deposited to protect sensor elements 402 and 403 from penetration of moisture and/or to increase the mechanical stability of sensor elements 402 and 403. The thickness of the layer(s) deposited on sensor elements 402 and 403 may be such that an adequate response sensitivity of sensor elements 402 and 403 remains ensured, i.e., the thermal capacity of the layer or layers should be as low as possible.

Figure 5:
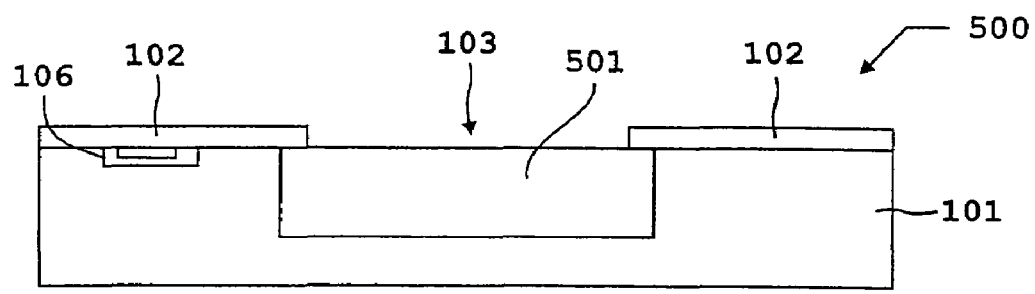
FIG. 5 shows a cross section of a precursor of a third variant of a heat transfer sensor according to an exemplary embodiment of the present invention having a single thick porous layer.

FIG. 5 shows a cross section of a precursor 500 of an exemplary second variant of a heat transfer sensor 600 according to the present invention (FIG. 6) having a single thick porous layer 501. The thickness of porous layer 501 is created by an exemplary method similar to that described in conjunction with FIGS. 1 through 3. However, porous layer 501 may be much thicker than layer 104 which has a low porosity, the thickness of porous layer 501 may be approximately 40 µm to 80 µm, including, for example, approximately 50 µm to 60 µm. In contrast with the heat transfer sensors described above, there is no provision here for formation of a cavity or a cavern 201. The porosity and/or pore size of porous layer 501 may be optimized by the exemplary etching method described above to reduce the thermal conductivity. For example, the porosity and/or pore size may be varied within porous layer 501. The porosity and/or pore size may be larger in the lower region of porous layer 501 which faces substrate 101 than in the upper region of porous layer 501, which faces sensor region 404. For example, the porosity in the upper region of porous layer 501 is up to max. 20% and in the lower region of porous layer 501 is up to max. 80%. Additionally or alternatively, thick porous layer 501 may be oxidized to further reduce thermal conductivity. A single thick porous layer 501 may provide, for example, a greater mechanical stability in comparison with a combination of a thin porous layer 104 and a cavern 201 and may have a higher thermal conductivity so that greater transfer of heat from the sensor region to the substrate may be provided.

Figure 6:
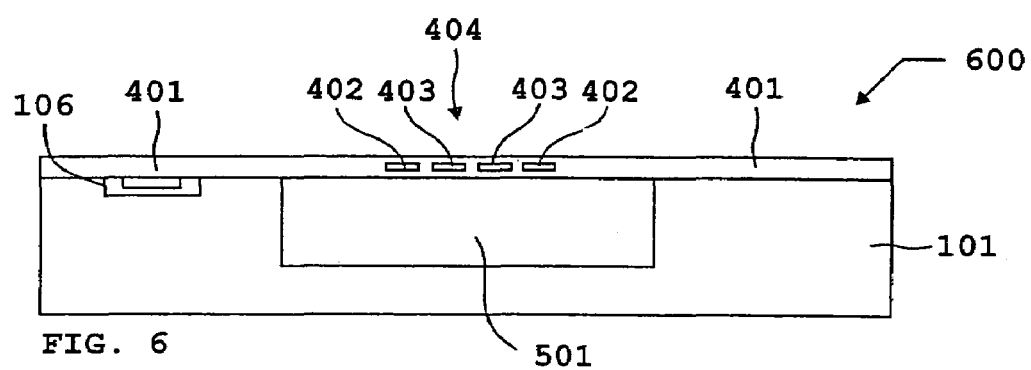
FIG. 6 shows a cross section of a heat transfer sensor manufactured on the basis of the precursor depicted in FIG. 5 and provided with sensor elements.

FIG. 6 shows a cross section through a heat transfer sensor 600 manufactured on the basis of the precursor depicted in FIG. 5. After removal of masking layer 102, one or more layers may be deposited on thick porous layer 501 and structured if required, with an airtight sealing of porous layer 501 optionally being provided. A sealing layer 401 may be deposited on thick porous layer 501 and includes, according to the exemplary embodiment in FIG. 4, one or more silicon layers, such as, for example, silicon oxide, silicon nitride, polysilicon or monocrystalline silicon layers. The sensor elements, including resistors 402 and 403, are created on sealing layer 401 by deposition and structuring of metal, such as, for example, platinum. Additional layers may be deposited on sensor elements 402 and 403 and structured.

Heat transfer sensor 600 is configured similarly to heat transfer sensor 400 in FIG. 4 for measuring air and/or gas masses so that the functioning of heat transfer sensor 600 is identical to the functioning of heat transfer sensor 400 according to FIG. 4. Heat transfer sensors 400 and 600 may be used in the automotive area, for example, in the intake area of motor vehicles to detect the intake currents for the purpose of optimizing the combustion mixture. However, all other areas of application in which air or gas masses are to be determined may be provided.

Heat transfer sensor 400 according to FIG. 4 may provide a desired thermal insulation of the sensor region with respect to the silicon substrate because of porous layer 104 and because of the formation of the cavity or cavern 201 beneath porous layer 104, whereas heat transfer sensor 600 according to FIG. 6 may have a desired mechanical stability with an increased manufacturing yield. For example, when the heat transfer sensor is positioned in the intake channel, it may be exposed to strong air currents or gas currents and to bombardment with particles, so an adequate mechanical stability should be ensured to achieve the longest possible lifetime. Furthermore, adequate thermal insulation, which may ensure a satisfactory response sensitivity, may be obtained due to the formation of a thick porous layer 501 having sufficient mechanical stability, for example, with a varying porosity and/or pore size.

Figure 7:
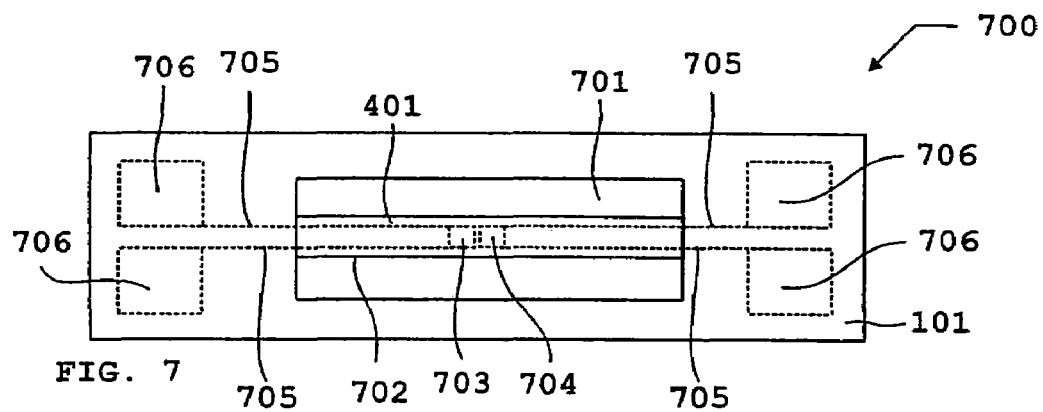
FIG. 7 shows a top view of a fourth variant of a heat transfer sensor according to an exemplary embodiment of the present invention having sensor elements which are provided for measuring the ambient pressure.

FIG. 7 shows a top view of an exemplary fourth variant of a heat transfer sensor 700, its sensor elements 703 and 704 being provided for measurement of the pressure of a gas, such as, for example, hydrogen, surrounding the sensor. Using the exemplary method according to the present invention as described above, a porous silicon layer (not shown) is created in silicon substrate 101 with a cavity or a cavern 701 beneath it, as depicted in FIGS. 1 and 2 for precursors 100 and 200 of heat transfer sensor 400. A sealing layer 401 is deposited on the porous layer and then sensor elements 703 and 704 are created on this layer according to the exemplary method explained with reference to FIG. 4. In addition, one or more integrated circuits may be provided for analysis of the measurement signals. Sensor elements 703 and 704 are configured as resistors, sensor element 703 functioning as a temperature sensor and sensor element 704 functioning as a heating element. In addition, one or more heating elements (not shown) may also be provided to be able to switch from one heating element to the other in the event of damage to a heating element. Heating element 704 and temperature sensor 703 are arranged next to one another and are connected to contact surfaces 706 via leads 705.

In operation, heating element 704 is heated by electric current and temperature sensor 703 measures the temperature. The heat emitted by the heating element to the gas surrounding the sensor depends on its pressure and its type, that is, the greater the ambient pressure, the greater is the quantity of heat transferred from the heating element to the gas. The ambient pressure and/or the type, including the composition of the gas, may be determined on the basis of the heat output which may be required to maintain a defined constant temperature.

To prevent dissipation of heat from heating element 704 into sealing layer 401 and into the porous layer, sealing layer 401 and porous layer 104 have been partially removed at the sides of sensor elements 703 and 704. The porous layer and sealing layer 401 form a web 702 above the cavity or cavern 701 which is open on one side. As an alternative, sealing layer 401 alone may be removed from the sides of sensor elements 703 and 704.

As an alternative, formation of a cavity or cavern may be omitted according to the exemplary embodiment as depicted in FIGS. 5 and 6, and instead a single thick porous layer (not shown) which may be oxidized may be provided. A sealing layer 401 which completely covers the porous layer or covers only a portion, such as, for example, as a web 702, is applied to the thick porous layer. As described above, sensor elements 703 and 704 are produced on sealing layer 401.

If required, additional layers may be deposited on sensor elements 703 and 704 and optionally structured.

What is claimed is:

1. A method for manufacturing a semiconductor component having a semiconductor substrate and a sensor region, the method comprising:
   forming a first porous layer to thermally insulate the sensor region at least partially from the semiconductor substrate;
   forming a second porous layer having a porosity of more than approximately 70% and less than 100%, beneath the first porous layer; and
   heating the second porous layer to form one of a cavity and a cavern beneath the first porous layer.

2. The method of claim 1, wherein the semiconductor component includes a multilayer semiconductor component.

3. The method of claim 1, wherein the semiconductor component includes a micromechanical component.

4. The method of claim 1, wherein the semiconductor component includes a heat transfer sensor.

5. The method of claim 1, wherein the semiconductor substrate includes silicon.

6. The method of claim 1, wherein the second porous layer has a porosity of approximately 80%.

7. The method of claim 1, herein at least one of the first and second porous layers are formed by one or more etching media.

8. The method of claim 7, wherein the one or more etching media include hydrofluoric acid.

9. The method of claim 7, wherein the one or more etching media are provided with one or more additives.

10. The method of claim 9, wherein the one or more additives at least one of reduce a formation of bubbles, improve a wetting, and improve a drying.

11. The method of claim 10, wherein the additives include an alcohol.

12. The method of claim 11, wherein the alcohol includes an ethanol.

13. The method of claim 12, wherein a volume concentration of the ethanol amounts to approximately 30% to approximately 80%.

14. The method of claim 7, wherein a doping of the semiconductor substrate to be etched, a current density in the etching media, a hydrofluoric acid concentration in the etching media, one or more additives to the etching media, and a temperature, represent method parameters.

15. The method of claim 14, wherein the semiconductor substrate includes silicon.

16. The method of claim 1, wherein at least one of the first and the second porous layers are formed by applying an electric field between a top and a bottom of the semiconductor component and establishing an electric current.

17. The method of claim 1, wherein method parameters for forming the second porous layer is selected so that a rate of expansion of one of the pores and cavities in the second porous layer is much higher than a rate of expansion of one of the pores and cavities in the first porous layer.

18. The method of claim 1, wherein method parameters for forming the second porous layer are selected so that one of pores and cavities of the second porous layer overlap with one another in a lateral direction to form one of a single, initially superficial pore and a single, initially superficial cavity.

* * * * *